United States Patent
Sudo et al.

(10) Patent No.: US 9,109,300 B2
(45) Date of Patent: Aug. 18, 2015

(54) VITREOUS SILICA CRUCIBLE PROVIDED WITH MINERALIZER ON ITS INNER SURFACE AND METHOD OF MANUFACTURING SILICON INGOT USING SAME

(75) Inventors: Toshiaki Sudo, Akita (JP); Hiroshi Kishi, Akita (JP)

(73) Assignee: SUMCO CORPORATION, Tokyo (JP)

( * ) Notice: Subject to any disclaimer, the term of this patent is extended or adjusted under 35 U.S.C. 154(b) by 593 days.

(21) Appl. No.: 13/179,280

(22) Filed: Jul. 8, 2011

(65) Prior Publication Data
US 2012/0017824 A1    Jan. 26, 2012

(30) Foreign Application Priority Data
Jul. 20, 2010    (JP) .................................. 2010-163331

(51) Int. Cl.
*C30B 15/10*    (2006.01)

(52) U.S. Cl.
CPC ........... *C30B 15/10* (2013.01); *Y10T 117/1032* (2015.01)

(58) Field of Classification Search
CPC ...... C30B 11/00; C30B 11/002; C30B 13/00; C30B 13/14; C30B 15/00; C30B 15/10; Y10T 117/00; Y10T 117/10; Y10T 117/1024; Y10T 117/1032
USPC ...................... 117/11, 13, 200, 206, 208, 928, 117/931–932; 422/243, 245.1, 292
See application file for complete search history.

(56) References Cited

U.S. PATENT DOCUMENTS

| | | | |
|---|---|---|---|
| 5,053,359 A * | 10/1991 | Loxley et al. ..................... 501/4 |
| 5,976,247 A | 11/1999 | Hansen et al. | |
| 6,106,610 A | 8/2000 | Watanabe et al. | |
| 2003/0094131 A1 | 5/2003 | Tsujimoto et al. | |
| 2003/0183161 A1 | 10/2003 | Tsujimoto et al. | |
| 2003/0211335 A1* | 11/2003 | McNulty et al. .............. 428/432 |
| 2009/0173276 A1* | 7/2009 | Satou ............................ 117/208 |
| 2009/0272315 A1* | 11/2009 | Fukui et al. ................... 117/208 |
| 2010/0077611 A1 | 4/2010 | Fujita et al. | |

(Continued)

FOREIGN PATENT DOCUMENTS

| EP | 2168924 A1 | 3/2010 |
|---|---|---|
| JP | 08-002932 A | 1/1996 |

(Continued)

OTHER PUBLICATIONS

A Notification of Reasons for Refusal issued by Japanese Patent Office with respect to Japanese counterpart patent application No. 2010-163331, mailed Nov. 26, 2013.

(Continued)

*Primary Examiner* — Kenneth A Bratland, Jr.
(74) *Attorney, Agent, or Firm* — Law Office of Katsuhiro Arai

(57) ABSTRACT

The present invention provides a vitreous silica crucible which can suppress buckling and sidewall lowering of the crucible in multi-pulling. According to the present invention, provided is a vitreous silica crucible for pulling a silicon single crystal, comprising a mineralizer on an inner surface of the crucible, wherein the mineralizer contains at least one atoms selected from the group consisting of Ca, Sr, Ba, Ra, Ti, Zr, Cr, Mo, Fe, Co, Ni, Cu, and Ag, and the concentration of the mineralizer on the inner surface is $1.0 \times 10^5$ to $1.0 \times 10^{17}$ atoms/cm$^2$.

3 Claims, 3 Drawing Sheets

(56) References Cited

U.S. PATENT DOCUMENTS

| | | | |
|---|---|---|---|
| 2010/0107965 A1* | 5/2010 | Fukui et al. | 117/35 |
| 2011/0214454 A1 | 9/2011 | Fujita et al. | |
| 2012/0006254 A1* | 1/2012 | Fujishiro et al. | 117/13 |

FOREIGN PATENT DOCUMENTS

| | | |
|---|---|---|
| JP | 09-110590 A | 4/1997 |
| JP | H11-171684 A | 6/1999 |
| JP | 3100836 B2 | 10/2000 |
| JP | 2002-029890 A | 1/2002 |
| JP | 2006-206342 A | 8/2006 |
| JP | 2007-204311 A | 8/2007 |
| KR | 10-2009-0028743 A | 3/2009 |

OTHER PUBLICATIONS

Extended European Search Report mailed Sep. 15, 2011, issued in EP counterpart Application No. EP 11172874.7.

Korea office action, mailed on Apr. 19, 2013, issued on counterpart Korean Application No. 520040074593.

A Notification of First Office Action issued by the State Intellectual Property Office of China, mailed Sep. 2, 2013, for Chinese counterpart application No. 201110195035.1.

Xu Changxing, "High purity quartz crucible pulling coating process", Chinese Journal of Rare Metals, Year 1985, Issue 1, p. 4-8.

* cited by examiner

Enlarged View of Region A

VITREOUS SILICA CRUCIBLE PROVIDED WITH MINERALIZER ON ITS INNER SURFACE AND METHOD OF MANUFACTURING SILICON INGOT USING SAME

CROSS-REFERENCE TO RELATED APPLICATION

This application is related to Japanese Patent Application No. 2010-163331 filed on Jul. 20, 2010, whose priory is claimed and the disclosure of which is incorporated by reference in its entirety.

BACKGROUND OF THE INVENTION

1. Field of the Invention

The present invention relates to a vitreous silica crucible and a method of manufacturing a silicon ingot.

2. Description of Related Art

In general, silicon single crystal is manufactured by melting high-purity polycrystalline silicon in a vitreous silica crucible to obtain silicon melt, dipping an end of a seed crystal to the silicon melt, and pulling the seed crystal while rotating it.

The melting point of silicon is 1410 deg. C, and thus the temperature of silicon melt is kept at a temperature higher than 1410 deg. C. At such temperature, a vitreous silica crucible reacts with silicon melt, and the thickness of the crucible wall gradually decreases. When the thickness of the crucible wall decreases, the strength of the crucible is lowered. This leads to problems such as buckling and sidewall lowering of the crucible.

Furthermore, island-like crystals are formed on the crucible inner surface by the reaction between the crucible and the silicon melt. These island-like crystals are called "brown rings" because the periphery of the island-like crystal is brown. The center portion of the brown ring is thin, and thus the center portion of the brown ring can be peeled off from the crucible inner surface when the thickness of the brown ring is further reduced by corrosion caused by reaction between the crucible and silicon melt. When the peeling occurs, there occur problems such as the peeled crystal pieces are mixed in a silicon ingot, and newly generated small crystals (the same constituent as the brown ring) are peeled off and mixed in a silicon ingot, which leads to deterioration of crystallinity of a silicon ingot.

In order to solve these problems, there is known a technique to add alkali earth metal on the crucible inner surface to crystallize the crucible inner surface. The crystallization enhances the crucible strength and suppresses generation of brown rings (See Japanese Patents 3046545 and 3100836).

SUMMARY OF THE INVENTION

A vitreous silica crucible is not sufficiently strong at high temperature. Thus, when the vitreous silica crucible is used for pulling a silicon ingot, the vitreous silica crucible is usually placed in a carbon susceptor having an inner surface substantially identical to the outer surface of the crucible. Usually, there is a slight gap between the inner surface of the carbon susceptor and the outer surface of the crucible.

When alkali earth metal is not added to the crucible inner surface, the viscosity lowers as the crucible is heated, and thus the crucible fits well with the carbon susceptor. In contrast, when alkali earth metal is added to the crucible inner surface in relatively high concentration as in the documents mentioned above, the crucible loses flexibility at an early stage of pulling a silicon ingot, and thus the crucible does not fit well with the carbon susceptor Conventionally, a vitreous silica crucible is used to pull a single silicon ingot, and after the single pulling, the vitreous silica crucible is discarded without being reused (such pulling is called "single pulling"). However, nowadays, for the purpose of cost reduction of a silicon ingot, a vitreous silica crucible is started to be used for multi-pulling, where after a first silicon ingot is pulled using a vitreous silica crucible, the vitreous silica crucible is re-used for pulling a second silicon ingot by re-charging and melting polycrystalline silicon before the crucible is cooled down. Thus, "multi-pulling" means pulling multiple silicon ingots using a single vitreous silica crucible.

When the crucible mentioned in the above documents is used for single pulling, the buckling and sidewall lowering of the crucible were prevented by the crystallized layer with high strength formed on the crucible inner surface. However, because this crucible does not fit well with the carbon susceptor by the reason mentioned above, the buckling and sidewall lowering of the crucible are likely to occur when the crucible is used for multi-pulling and the wall thickness is reduced due to corrosion. When the buckling occurs in the crucible whose inner surface is crystallized, a large amount of crystal pieces mix in the silicon melt, which results in deterioration of the yield of silicon crystal.

The present invention has been made in view of these circumstances, and provides a vitreous silica crucible which can suppress buckling and sidewall lowering of the crucible in multi-pulling.

According to the present invention, provided is a vitreous silica crucible for pulling a silicon single crystal, including a mineralizer on an inner surface of the crucible, wherein the mineralizer contains at least one atoms selected from the group consisting of Ca, Sr, Ba, Ra, Ti, Zr, Cr, Mo, Fe, Co, Ni, Cu, and Ag, and the concentration of the mineralizer on the inner surface is $1.0 \times 10^5$ to $1.0 \times 10^{17}$ atoms/cm$^2$.

The crucible of the present invention is characterized in that a mineralizer is disposed on an inner surface of the crucible, and the mineralizer contains at least one atoms selected from the group consisting of Ca, Sr, Ba, Ra, Ti, Zr, Cr, Mo, Fe, Co, Ni, Cu, and Ag, and the concentration of the mineralizer on the inner surface is $1.0 \times 10^5$ to $1.0 \times 10^{17}$ atoms/cm$^2$.

This concentration is lower than that disclosed in Japanese Patents 3046545 and 3100836 mentioned above. When the concentration of the mineralizer on the inner surface is such low, crystallization of the inner surface is promoted to a small extent, and thus brown rings are formed on the inner surface by the reaction between the silicon melt and the crucible before the entire inner surface is covered with a crystallized layer.

In addition, the mineralizer promotes crystallization of the center portion of the brown ring, and increases the thickness of the crystallized layer in the center portion. The diameter of the brown ring increases as the contact time with the silicon melt increases, and thus most portion of the crucible inner surface is covered with brown rings after elapse of long time, and the crucible is strengthened. When the thickness of the center portion of the brown ring increases, peeling of the brown ring is prevented, and thus deterioration of crystallinity of the silicon ingot is prevented.

In case that the concentration of the mineralizer on the crucible inner surface is relatively high as in Japanese Patents 3046545 and 3100836 mentioned above, when the crucible is heated, the entire inner surface is crystallized and becomes rigid within a relatively short period of time, and thus the crucible does not fit well with a surrounding carbon susceptor. When stress due to thermal strain is applied to the crucible inner surface, cracks can be formed in the crystallized layer on the inner surface. When cracks are formed, a vitreous silica surface located under the crystallized layer is exposed, and thus there occurs a problem which is the same as in the crucible not having a mineralizer on the inner surface. In contrast, according to the crucible of the present invention, brown rings are not formed on the entire inner surface at an early stage of heating, and thus the problems that cracks are formed on the crystallized layer can be avoided.

In addition, crystallization of the crucible inner surface is relatively slow in the crucible of the present invention, and thus when the crucible is heated for pulling a silicon ingot, the crucible is softened and fits well with the carbon susceptor, and thus the crucible is firmly retained by the carbon susceptor. Because the crucible fits well with the carbon susceptor, buckling and sidewall lowering of the crucible is difficult to occur even when the crucible is used for multi-pulling.

DESCRIPTION OF THE PREFERRED EMBODIMENTS

1. Configuration of Vitreous Silica Crucible

Figure 1:
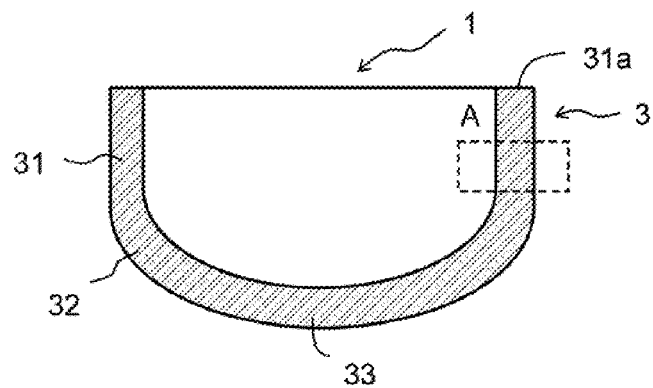
FIG. 1 is a sectional view showing structure of a vitreous silica crucible, according to an embodiment of the present invention.
Figure 2:
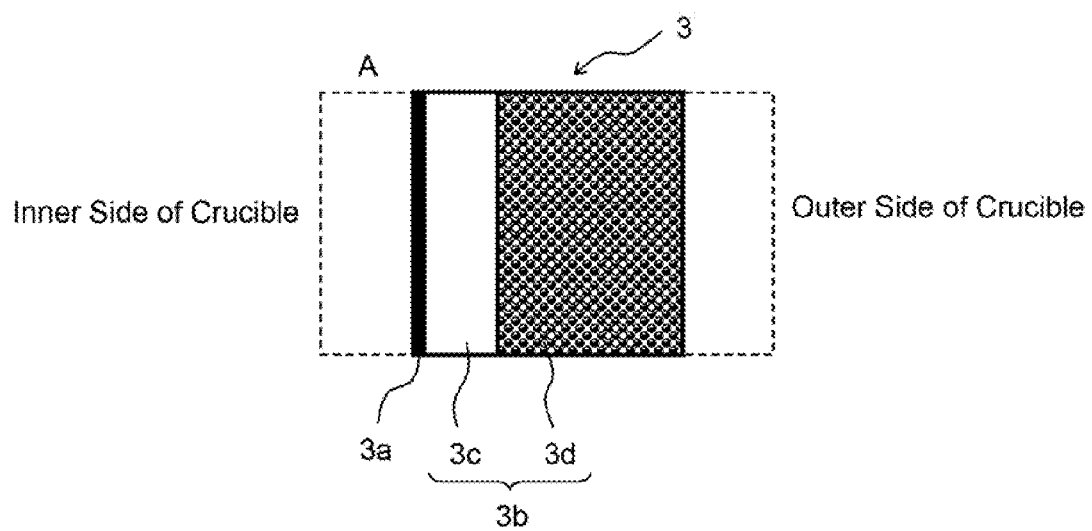
FIG. 2 is an enlarged view of the region A in FIG. 1.

Hereinafter, with reference to FIGS. 1 and 2, embodiments of a vitreous silica crucible of the present invention will be explained. FIG. 1 is a sectional view showing a structure of a vitreous silica crucible of the present embodiment, and FIG. 2 is an enlarged view of the region A in the FIG. 1.

The vitreous silica crucible 1 of the present embodiment is for pulling a silicon single crystal, and includes a mineralizer 3a on an inner surface of the crucible 1. The mineralizer 3a include at least one atoms of Ca, Sr, Ba, Ra, Ti, Zr, Cr, Mo, Fe, Co, Ni, Cu, and Ag. The mineralizer concentration on the inner surface is $1.0 \times 10^5$ to $1.0 \times 10^{17}$ atoms/cm$^2$.

Here, the respective components are explained in detail.

(1) Vitreous Silica Crucible 1

The vitreous silica crucible 1 of the present embodiment is used for pulling a silicon single crystal, and can be used for either single pulling and multi-pulling, but it is preferred to be used for multi-pulling. This is because the vitreous silica crucible 1 of the present embodiment solves problems which, as mentioned above, are eminent in multi-pulling, more effectively than an conventional crucible.

(2) Wall 3 of Vitreous Silica Crucible

As shown in the sectional view of FIG. 1, the wall 3 of vitreous silica crucible 1 has a corner portion 32, a cylindrical sidewall portion 31, and a bottom portion 33. The corner portion 32 has a relatively large curvature. The sidewall portion 31 has a rim portion having an upward opening. The bottom portion 33 is flat or has a relatively small curvature, and is mortar-shaped. In the present invention, the corner portion refers to a portion connecting the sidewall portion 31 and the bottom portion 33, and starts at a point where a line tangential to the corner portion 32 overlaps with the sidewall portion 31 and ends at a point where the corner portion 32 and the bottom portion 33 have a common tangential line. In other words, the boundary between the sidewall portion 31 and the corner portion 32 is a point where a straight portion of the wall 3 starts to curve. Furthermore, the portion with a constant curvature at the bottom of the crucible is the bottom portion 33, and as the distance from the center of the crucible increases, a point where the curvature starts to change is the boundary between the bottom portion 33 and the corner portion 32.

The wall 3 includes, from the inner surface to the outer surface of the crucible 1, a mineralizer 3a and a vitreous silica layer 3b.

(2-1) Mineralizer 3a

The mineralizer 3a is disposed on the inner surface of the crucible 1. The concentration of mineralizer 3a on the inner surface is $1.0 \times 10^5$ to $1.0 \times 10^{17}$ atoms/cm$^2$. When the mineralizer 3a with such low concentration is disposed on the inner surface, after pulling of a silicon ingot is started and before the entire inner surface of the crucible is covered with a crystallized layer, brown rings are formed on the inner surface of the crucible by the reaction between the silicon melt and the crucible, and then crystallization of the center portion of the brown ring is promoted by the effect of the mineralizer 3a, and thus the thickness of the center portion of the brown ring increases, and thus the peeling of the center portion is prevented. Furthermore, because the thickness of the center portion of the brown ring increases, even when the thickness of the crystalline center portion of the browning is reduced by corrosion, the vitreous silica surface is unlikely to be exposed. The diameter of the brown ring increase as the contact time between the crucible and the silicon melt increases.

In other words, the area occupied by brown rings in the inner surface of the crucible increases as the contact time increases. The mineralizer 3a promotes the growth of the brown ring in the radial direction as well and thus for the portion, of the crucible inner surface, contacting silicon melt for 100 hours or more, the ratio of the area occupied by brown rings is 80% or more. In other words, when the crucible 1 is used for long-time pulling, most portion of the inner surface of the crucible 1 is occupied by brown rings. In the crucible 1 of the present embodiment, because the center portion of the brown ring is crystallized, and thus the inner surface of the crucible is covered with brown rings each having relatively large thickness (and thus relatively high strength), buckling and sidewall lowering of crucible 1 after long-time use can be prevented.

When the concentration of the mineralizer 3a is higher than $1.0 \times 10^{17}$ atoms/cm$^2$, crystallization of the crucible inner surface is promoted and thus the entire inner surface of the crucible 1 is covered with a crystallized layer at an early stage after the start of pulling a silicon ingot. Therefore, there can occur the same problem with that mentioned in the section of "SUMMARY OF THE INVENTION". When the concentration of the mineralizer 3a is lower than $1.0 \times 10^5$ atoms/cm$^2$, crystallization of the center portion of the brown ring is not sufficiently promoted. Therefore, the concentration of the mineralizer is $1.0 \times 10^5$ to $1.0 \times 10^{17}$ atoms/cm$^2$. Furthermore, concentration of mineralizer is preferably $1.0 \times 10^8$ to $1.0 \times 10^{14}$ atoms/cm$^2$. When the concentration is $1.0 \times 10^8$ atoms cm$^2$ or more, the effect of promoting crystallization of the center portion of the brown ring is in particular high, and when the concentration is $1.0 \times 10^{14}$ atoms/cm$^2$ or less, the rate of crystallization is not too fast, and thus the crucible 1 fits well with the carbon susceptor.

The mineralizer 3a contains at least one atoms of Ca, Sr, Ba, Ra, Ti, Zr, Cr, Mo, Fe, Co, Ni, Cu, and Ag. These atoms have a function to promote crystallization of the crucible inner surface. Furthermore, the mineralizer 3a preferably contains at least one atoms of Ca, Ba, Fe, and Ti because these atoms have particularly strong effect to promote crystallization of the center portion of the brown ring. Furthermore, the mineralizer 3a preferably contains at least one atoms of Ca and Fe, and most preferably contains Ca. When Ca or Fe is used as the mineralizer 3a, the single crystallization yield is particularly high even in multi-pulling.

The concentration of mineralizer on the crucible inner surface can be measured in the following way. First, a cleaning liquid to dissolve the mineralizer is prepared by mixing high-purity hydrochloric acid, high-purity nitric acid and/or high-purity perchloric acid with ultra pure water. For example, 1000 ml of the cleaning liquid can be prepared by mixing 250 ml of high-purity hydrochloric acid [36%], 20 ml of high-purity nitric acid [68%], and 200 ml of high-purity perchloric acid [35%] (these are made by Tama Chemicals Co., Ltd. or Wako Pure Chemical Industries, Ltd.) with ultra pure water. The obtained cleaning liquid is sprayed onto the inner surface (on which the mineralizer is attached) of the vitreous silica crucible to capture the mineralizer from the inner surface of the crucible. Then, the liquid accumulated on the bottom of the crucible is collected and the acid therein is evaporated so as not to evaporate the solution completely.

After cooling, the same acid as the reference solution used for correction of measurement (the solution whose concentration is exactly known, and is used for titration) is added thereto, and the resultant solution is quantified. The measurement is performed by use of ICP-MS which uses plasma for the ion source and detects the generated ions by use of the mass spectrometry unit. Measurement is performed by preparing a calibration curve by used of a standard solution prepared from the reference solution, and then measuring the concentration of the quantified solution. The measured concentration, the constant volume, and the amount of sample are inputted to the following formula, to determine the weight per unit area ($ng/cm^2$).

$$C(ng/cm^2)=(Cs-Cb)\times K\times (B/M)\times A/X$$

Cs: detected concentration for each of the elements in the sample solution (ppm)
Cb: detected concentration for each of the elements in the blank test solution (ppm)
B: constant volume (ml or g)
M: the amount of sample (ml)
A: the amount of usage of the cleaning liquid (ml)
K: the coefficient obtained from the standard solution
X: sample area ($cm^2$)

(2-2) Vitreous Silica Layer 3b

The vitreous silica layer 3b is a layer of vitreous silica. The configuration of the vitreous silica layer 3b is not in particular limited, but the layer contacting the mineralizer 3a is preferably a synthetic vitreous silica layer (hereinafter referred to as "synthetic layer") 3c. Furthermore, it is preferred that a natural vitreous silica layer (hereinafter referred to as "natural layer") 3d is provided on the outer side of the synthetic layer 3c.

The synthetic layer 3c is a layer made of vitreous silica obtained by fusing and solidifying chemically synthesized amorphous or crystalline silica (silicon oxide) (hereinafter, such vitreous silica is referred to as "synthetic vitreous silica") powder, and has very low impurity concentration. Therefore, it is possible to reduce the amount of impurities mixed in silicon melt by providing the synthetic layer 3c on the inner layer of the crucible 1. The method of chemical synthesis of silica is not in particular limited, and, may be, for example, gas phase oxidation (dry synthesis) of silicon tetrachloride ($SiCl_4$), or hydrolysis (sol-gel method) of silicon alkoxide ($Si(OR)_4$).

Chemically synthesized silica is amorphous, and does not substantially contain crystalline microstructure, and thus the structure is easily changed. Thus, the synthetic layer formed by fusing and solidifying such silica has relatively low viscosity and is easily crystallized.

Because the synthetic layer 3c is easily crystallized, when the crucible 1 having the synthetic layer 3c and the mineralizer 3a contacting each other is heated, brown rings are easily formed on the synthetic layer 3c by the effect of the mineralizer 3a and crystallization of the center portion of the brown ring is promoted.

The natural layer 3d is a layer disposed on the outer side of the synthetic layer 3c. The natural layer 3d is a layer formed of vitreous silica obtained by fusing and solidifying silica powder obtained from natural mineral whose main component is α-quartz (hereinafter, such vitreous silica is referred to as "natural vitreous silica"). When α-quartz is fused, the viscosity is largely reduced. However, the chain structure of the repetition of SiO bond is not completely destroyed, and thus natural vitreous silica still contains crystalline microstructure therein, and thus natural vitreous silica is not easily deformed. Thus, the natural layer 3d has high viscosity, and enhances the crucible strength.

2. Method of Manufacturing Vitreous Silica Crucible

The vitreous silica crucible 1 of the present embodiment can be manufactured by the processes of (1) forming a silica powder layer for a vitreous silica layer by depositing crystalline or amorphous silica powder on the inner surface (the bottom surface and the side surface) of a rotating mold, and (2) vitrifying the silica powder layer by heating and fusing the silica powder layer up to a temperature of 2000 to 2600 deg. C. by use of arc discharge, followed by cooling.

The silica powder to form the natural layer (natural silica powder) can be manufactured by pulverizing natural mineral whose main component is α-quartz.

The silica powder to form the synthetic layer (synthetic silica powder) can be manufactured by chemical synthesis, such as gas phase oxidation (dry synthesis) of silicon tetrachloride ($SiCl_4$), or hydrolysis (sol-gel method) of silicon alkoxide ($Si(OR)_4$).

The method of adding the mineralizer 3a to the inner surface of the crucible obtained in the above-mentioned method is not in particular limited. For example, the mineralizer 3a can bed added by dissolving or dispersing oxide or salts (e.g. inorganic salt, nitrate, carbonate, sulfate, acetate, oxalate, fluoride salt, phosphate, oxide, peroxide, hydroxide, chloride) of Ca, Sr, Ba, Ra, Ti, Zr, Cr, Mo, Fe, Co, Ni, Cu, and Ag in a solvent of water, organic solvent (e.g. alcohol), or the mixture, and applying the obtained solution or dispersion on the vitreous silica layer 3b, and thereafter, as necessary, heating it.

Furthermore, the mineralizer 3a can be added by adding a mineralizer to silica powder (preferably, synthetic silica powder) (the obtained silica powder is referred to as "mineralizer-added silica powder), depositing the mineralizer-added silica powder to the silica powder layer for a vitreous silica layer, then arc-fusing the mineralizer-added silica powder. In one example, the mineralizer-added silica powder can be prepared by mixing silica powder with alkoxide of a mineralizer, followed by firing at a temperature of 600 deg. C. to 1100 deg. C. to attach the mineralizer to the surface of the silica powder.

A transparent layer having virtually no bubbles (i.e. bubble content of less than 0.5%) can be formed by subjecting the silica powder layer to a reduced pressure of −50 kPa or more and less than −95 kPa while fusing the silica powder layer. Furthermore, after the transparent layer is formed, a bubble-containing layer having a bubble content of 1% or more and less than 50% can be formed on the outer side of the transparent layer by subjecting the silica powder layer to a pressure of 0 kPa or more and less than −10 kPa. In the present specification, the bubble content rate refers to the ratio $(w_2/w_1)$ of the volume $(w_2)$ occupied by bubbles in a unit volume $(w_1)$ of the crucible 1.

3. Method of Manufacturing Silicon Ingot

A silicon ingot can be manufactured by the processes of (1) forming silicon melt by melting polycrystalline silicon in the vitreous silica crucible 1 of the present embodiment, and (2) dipping an end of a silicon seed crystal to the silicon melt, and pulling the seed crystal while rotating the seed crystal. The silicon single crystal has a shape having, from the upper side, a cylindrical silicon seed crystal, a cone-shaped silicon single crystal, a cylindrical silicon single crystal having the same diameter as the base of the upper cone (hereinafter, referred to as "straight body portion"), a cone-shaped silicon single crystal having a downward apex.

When a silicon ingot is pulled by use of the crucible 1 of the present embodiment, brown rings are formed on the inner surface of the crucible 1, and crystallization of the center portions of the brown rings is promoted. Therefore, by use of the crucible of the present embodiment, it is possible to pull a silicon ingot without exposing a vitreous silica surface in the inside of the brown ring.

When multi-pulling is performed, polycrystalline silicon is recharged and melted in the vitreous silica crucible, and thereafter another silicon ingot is pulled.

By use of the crucible in JP Patent 3046545 or 3100836 mentioned above, the crucible inner surface is crystallized before the crucible fits with the carbon susceptor, and thus the crucible does not fit well with the carbon susceptor. Therefore, when the crucible is used for multi-pulling, and the wall thickness is reduced by corrosion, buckling or sidewall lowering is likely to occur.

In contrast, by use of the crucible of the present embodiment, the crystallization of the crucible inner surface is relatively slow, and thus the crucible can fit well with the carbon susceptor, and after long-time use, the entire or most portion of the inner surface is covered with brown rings having grown to a large extent. Therefore, buckling or sidewall lowering is unlikely to occur. Furthermore, according to the crucible of the present embodiment, crystallization of the center portion of the brown ring is promoted, and thus exposure of a vitreous silica surface on the inside of the brown ring can be prevented.

Example

1. Influence of Constitution of Mineralizer on Crystallinity

Crucibles each having an outer diameter of 800 mm, and a wall thickness of 15 mm (from the inner side, 1 mm of a synthetic layer and 14 mm of a natural layer) were manufactured. An aqueous solution of hydroxide of a mineralizer was applied or sprayed on the inner surface of the crucible of Examples and Comparative Examples. Thereafter, the crucible was heated to 200 deg. C. under the air atmosphere so that the mineralizer adhered to the inner surface firmly.

TABLE 1

| | Mineralizer | |
| --- | --- | --- |
| | Kinds of Atoms Contained in Mineralizer | Concentration (atoms/cm$^2$) |
| Ex. 1 | Ca | $1 \times 10^6$ |
| Ex. 2 | Ca | $3 \times 10^{11}$ |
| Ex. 3 | Ca | $1 \times 10^{17}$ |
| Ex. 4 | Ti | $3 \times 10^{11}$ |
| Ex. 5 | Fe | $3 \times 10^{11}$ |
| Ex. 6 | Ba | $3 \times 10^{11}$ |
| Comp. Ex. 1 | Ca | $1 \times 10^4$ |
| Comp. Ex. 2 | Ca | $1 \times 10^{20}$ |
| Comp. Ex. 3 | Ba | $1 \times 10^{20}$ |

Three silicon ingots each having a diameter of 300 mm were pulled by use of the crucibles of Examples and Comparative Examples. When the ingots were pulled, the crucible was supported by a carbon susceptor. Each time one silicon ingot was pulled, polycrystalline silicon was recharged and melted. Crystallinity of the three silicon ingots was evaluated. Evaluation of the crystallinity was performed based on the single crystallization yield. The single crystallization yield was a value of (mass of straight body section of silicon single crystal)/(mass of silicon melt charged in the crucible right before pulling). The results are shown in Table 2. The evaluation criteria in Table 2 are as follows:

A: single crystallization yield is 0.80 or more and less than 0.99

B: single crystallization yield is 0.70 or more and less than 0.80

C: single crystallization yield is 0.60 or more and less than 0.70

TABLE 2

| | First Ingot | Second Ingot | Third Ingot |
| --- | --- | --- | --- |
| Ex. 1 | A | A | B |
| Ex. 2 | A | A | A |
| Ex. 3 | A | A | B |
| Ex. 4 | A | A | B |
| Ex. 5 | A | A | A |
| Ex. 6 | A | A | B |
| Comp. Ex. 1 | B | C | D |
| Comp. Ex. 2 | A | C | D |
| Comp. Ex. 3 | A | C | D |

As is clear from Table 2, crystallinity of the first silicon ingot was good for any cases where the crucibles of Examples and Comparative Examples were used. However, for the second and third silicon ingot, the crystallinity for the case where the crucibles of Examples were used was much better than that for the case where the crucibles of Comparative Examples were used. Furthermore, when the crucibles of Examples 2 and 5 were used, the crystallinity of the third silicon ingot was very good. These results show that silicon ingots with good crystallinity can be obtained by use of the crucible of the present invention, even when multi-pulling is performed.

2. Influence of Constitution of Mineralizer on Crystallization Yield

Figure 3:
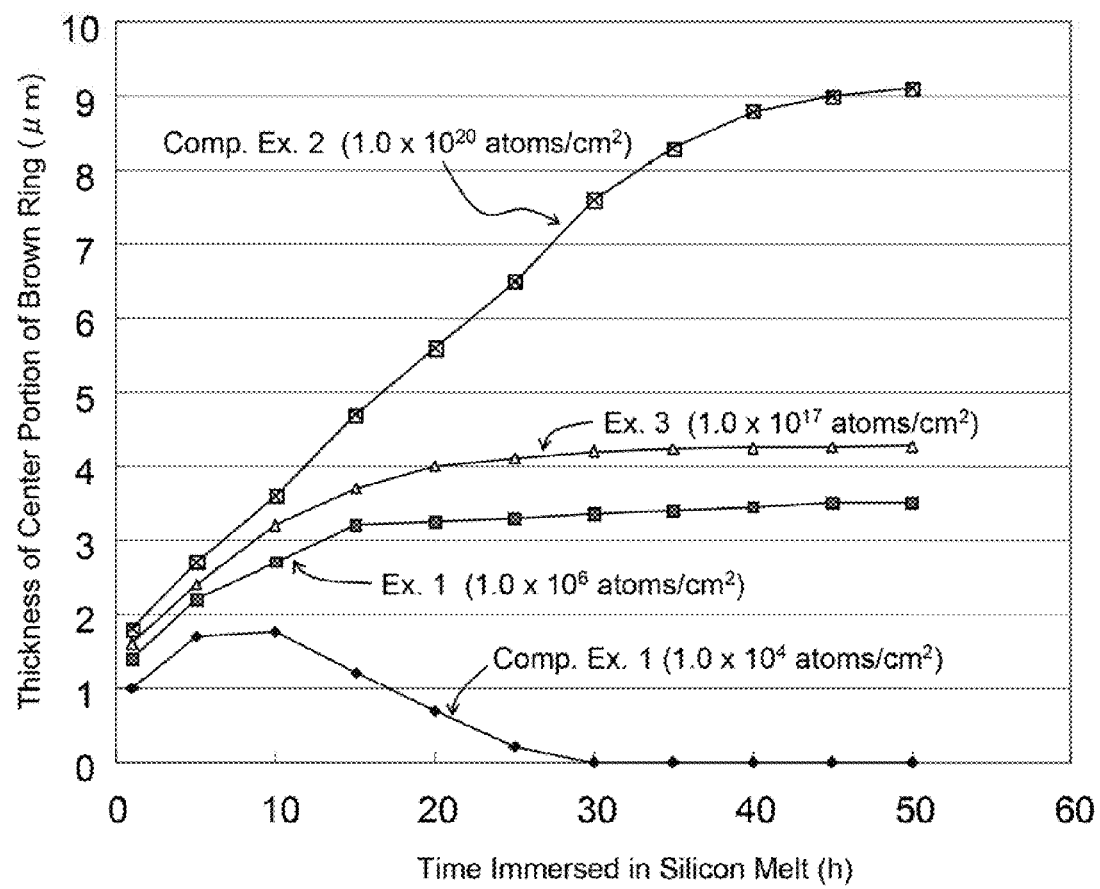
FIG. 3 is a graph showing the relationship between the immersion time and the thickness of the crystallized layer in the center portion of the brown ring, in Examples.
Figure 4:
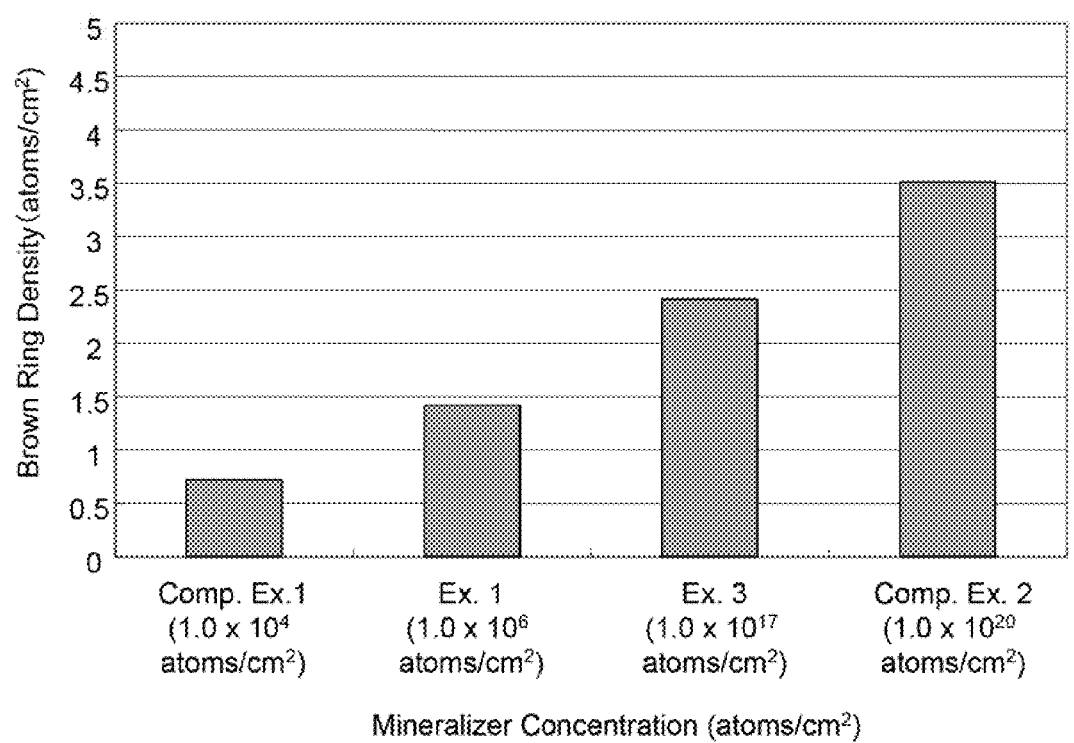
FIG. 4 is a graph showing the mineralizer concentration and the brown ring density, in Examples.

In order to investigate the reason for the results shown in Table 2, the crucibles of Examples 1 and 3 and Comparative Examples 1 and 2 were immersed in silicon melt at 1450 deg. C. Then, the relationship between the immersion time and the thickness of the crystallized layer in the center portion of the brown ring was investigated. In addition, the relationship between the mineralizer concentration and the brown ring density was also investigated. The results are shown in FIGS. 3 and 4. FIG. 4 shows the brown ring density after an elapsed time of 50 hours.

With reference to FIGS. 3 and 4, the followings can be read. In Comparative Example 1, the crystallization yield of the brown ring center portion was too slow, and therefore the thickness of the crystallized layer of the center portion decreased due to corrosion as the immersion time increased, and finally the vitreous silica surface was exposed after 30-hour immersion. In Comparative Example 2, the crystallization yield was very high and the brown ring density was high, the entire inner surface of the crucible was crystallized at a relatively early stage. In Examples 1 and 3, the brown ring density was lower than Comparative Example 2, and the brown ring size was also smaller than Example 2, and thus the entire inner surface was not crystallized.

In sum, in Comparative Example 1, because the vitreous silica surface was exposed, the crystallinity of the silicon ingots deteriorated. In Comparative Example 2, because the entire inner surface was crystallized at an early stage after the start of pulling a silicon ingot, the crucible did not sufficiently fit with the carbon susceptor, and thus the crystallinity of the silicon ingots deteriorated in multi-pulling.

What is claimed is:

1. A vitreous silica crucible for pulling a silicon single crystal, comprising a mineralizer disposed only on an entire innermost surface of the crucible, wherein the mineralizer contains at least one atoms selected from the group consisting of Ca and Fe, and the concentration of the mineralizer on the inner surface is $1.0 \times 10^8$ to $3.0 \times 10^{11}$ atoms/cm$^2$ as measured by spraying a cleaning liquid for dissolving the mineralizer onto the inner surface to capture the mineralizer from the inner surface in an accumulated liquid at a bottom of the crucible, and determining the concentration of the mineralizer per cm$^2$ of the inner surface from a concentration of the mineralizer in the accumulated liquid.

2. A method of manufacturing a silicon ingot comprising the process of pulling a silicon ingot by melting polycrystalline silicon in the crucible of claim 1.

3. The method of claim 2, further comprising the process of, after the pulling, recharging and melting polycrystalline silicon therein, and pulling another silicon ingot.

* * * * *